(12) United States Patent
Tsuruoka et al.

(10) Patent No.: US 10,034,377 B2
(45) Date of Patent: Jul. 24, 2018

(54) DISPLAY DEVICE

(71) Applicant: Japan Display Inc., Tokyo (JP)

(72) Inventors: Kazuto Tsuruoka, Tokyo (JP); Norio Oku, Tokyo (JP); Takuya Nakagawa, Tokyo (JP)

(73) Assignee: Japan Display Inc., Tokyo (JP)

( * ) Notice: Subject to any disclaimer, the term of this patent is extended or adjusted under 35 U.S.C. 154(b) by 32 days.

(21) Appl. No.: 15/070,120

(22) Filed: Mar. 15, 2016

(65) Prior Publication Data

US 2016/0278210 A1    Sep. 22, 2016

(30) Foreign Application Priority Data

Mar. 18, 2015 (JP) ................................. 2015-054593

(51) Int. Cl.
| | | |
|---|---|---|
| *H05K 1/00* | (2006.01) | |
| *H05K 1/14* | (2006.01) | |
| *H05K 1/11* | (2006.01) | |
| *G02F 1/1345* | (2006.01) | |
| *H05K 1/03* | (2006.01) | |

(52) U.S. Cl.
CPC ............ *H05K 1/144* (2013.01); *H05K 1/142* (2013.01); *H05K 1/0353* (2013.01); *H05K 1/14* (2013.01); *H05K 1/147* (2013.01); *H05K 2201/042* (2013.01); *H05K 2201/05* (2013.01); *H05K 2201/058* (2013.01); *H05K 2201/10128* (2013.01); *H05K 2201/10681* (2013.01)

(58) Field of Classification Search
CPC ..... H05K 2201/05; H05K 2201/10681; H05K 1/0353; H05K 1/14; H05K 1/142; H05K 1/147; H01L 2224/50; G02F 1/13452; G02F 1/13458

USPC ............... 361/749, 750, 784, 789, 790, 791; 349/150–152
See application file for complete search history.

(56) References Cited

U.S. PATENT DOCUMENTS

| | | | |
|---|---|---|---|
| 2002/0151196 A1* | 10/2002 | Tai | H05K 3/20 439/67 |
| 2007/0152577 A1 | 7/2007 | Cho et al. | |
| 2008/0283284 A1* | 11/2008 | Koyama | H05K 3/361 174/261 |
| 2013/0002133 A1 | 1/2013 | Jin et al. | |
| 2013/0264103 A1* | 10/2013 | Ye | H05K 1/0213 174/254 |

(Continued)

FOREIGN PATENT DOCUMENTS

| | | |
|---|---|---|
| JP | H11-054876 A | 2/1999 |
| JP | 2006120471 A | 5/2006 |

(Continued)

OTHER PUBLICATIONS

Korean Office Action dated Mar. 15, 2017 for corresponding KR Patent Application No. 10-2016-0028756, with translation.

(Continued)

*Primary Examiner* — Binh Tran
(74) *Attorney, Agent, or Firm* — Typha IP LLC (57) ABSTRACT

A display device includes a flexible insulating substrate, an insulating layer on the insulating substrate, and a plurality of terminals made of a conductive material on the insulating layer. The insulating layer is disposed outside the area located between the terminals. The insulating substrate has a groove between the terminals.

12 Claims, 6 Drawing Sheets

(56) References Cited

U.S. PATENT DOCUMENTS

2014/0247405 A1    9/2014   Jin et al.
2015/0214255 A1*   7/2015   Chikama .......... H01L 29/66765
                                                             257/43

FOREIGN PATENT DOCUMENTS

| JP | 2007183605 A  | 7/2007 |
| JP | 2011-085923 A | 4/2011 |
| JP | 2011-107391 A | 6/2011 |
| JP | 2013015835 A  | 1/2013 |

OTHER PUBLICATIONS

Japanese Office Action dated Mar. 13, 2018 for corresponding Japanese Patent Application No. 2015-054593 with partial translation.

* cited by examiner

DISPLAY DEVICE

CROSS-REFERENCE TO RELATED APPLICATION

The present application claims priority from Japanese application JP2015-054593 filed on Mar. 18, 2015, the content of which is hereby incorporated by reference into this application.

BACKGROUND OF THE INVENTION

1. Field of the Invention

The present invention relates to a display device.

2. Description of the Related Art

As disclosed in JP 2007-183605 A and JP 2013-015835 A, flexible display devices, each including a flexible substrate, are conventionally known. Such a flexible display device includes an insulating substrate, an insulating layer containing silicon that is formed on the insulating substrate, and a plurality of terminals made of a conductive material that are formed on the insulating layer. In this flexible display device, a flexible wiring substrate is joined to the terminals on the insulating substrate via an anisotropic conductive material containing conductive particles dispersed in a thermosetting resin. The terminals on the insulating substrate and the flexible wiring substrate are electrically coupled to each other through the conductive particles.

When the anisotropic conductive material provided between the insulating substrate and the flexible wiring substrate is caused to first flow by heat and pressure and then to cure, the terminals on the insulating substrate and the flexible wiring substrate become joined together by the anisotropic conductive material. During that time, the anisotropic conductive material may escape from between the insulating substrate and the flexible wiring substrate. For example, JP 2006-120471 A discloses a flexible circuit board (flexible wiring substrate) that has a through hole formed in it. This flexible circuit board, which enables a resin to flow into the through hole, will prevent the resin from escaping from between a substrate (insulating substrate) and the flexible circuit board, but will allow the resin to escape from the surface of the flexible circuit board through the through hole.

SUMMARY OF THE INVENTION

In view of the above problem, it is an object of the present invention to prevent escape of a material for joining an insulating substrate and another substrate.

A display device according to an aspect of the present invention includes a flexible insulating substrate, an insulating layer on the insulating substrate, and a plurality of terminals made of a conductive material on the insulating layer. The insulating layer is disposed outside the area located between the terminals. The insulating substrate has a groove between the terminals. This display device allows enough space to be filled with a material for joining an insulating substrate and another substrate, thus preventing the material from escaping.

DETAILED DESCRIPTION OF THE INVENTION

The following describes an embodiment of the present invention (hereinafter, referred to as this embodiment) with reference to the accompanying drawings. The disclosure herein is merely an example, and appropriate modifications coming within the spirit of the present invention, which are easily conceived by those skilled in the art, are intended to be included within the scope of the invention as a matter of course. In some drawings, the widths, the thicknesses, the shapes, and other characteristics of various parts are schematically shown for clarity of illustration, as compared to actual configurations. However, such schematic drawings are merely examples and are not intended to limit the present invention. In the present specification and drawings, some elements identical or similar to those previously shown are denoted by the same reference signs as the previously-shown elements, and thus are not described in detail herein as appropriate.

Figure 1:
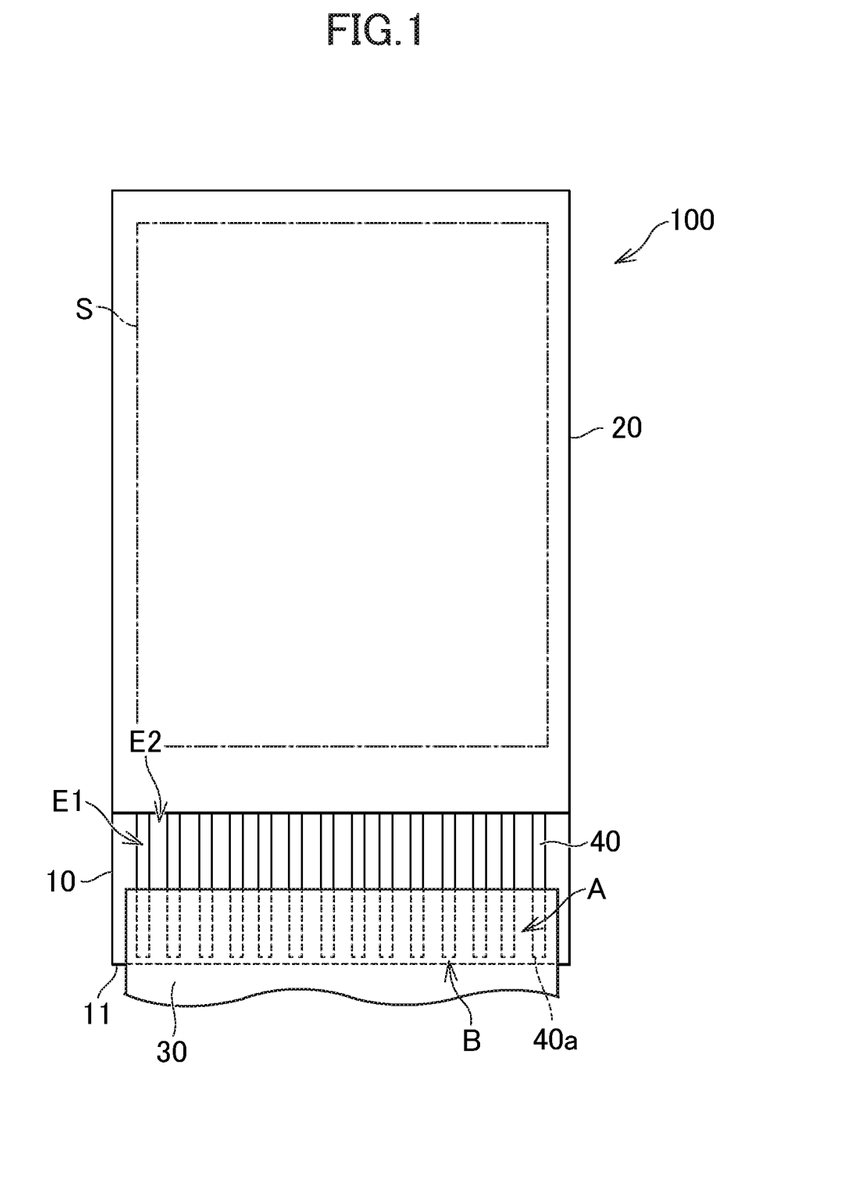
FIG. 1 is a diagram schematically showing a display device according to an embodiment of the present invention.

First, a general configuration of a display device 100 according to this embodiment is described with reference to FIG. 1. FIG. 1 is a diagram schematically showing the display device 100 according to this embodiment. The display device 100 according to this embodiment is used, for example, as the display device of a mobile terminal.

As shown in FIG. 1, the display device 100 includes an insulating substrate 10, a counter substrate 20, and a flexible wiring substrate 30. The insulating substrate 10 and the counter substrate 20 are both substantially rectangular in plan and are arranged to face each other. The flexible wiring substrate 30 is mounted on one edge in the longitudinal direction (the vertical direction in FIG. 1) of the insulating substrate 10. The following describes the configuration of the display device 100 in more detail.

The insulating substrate 10 is a flexible substrate. An insulating layer 50 containing silicon is formed on the insulating substrate 10, and a plurality of terminals 40 made of a conductive material are disposed on the insulating layer 50. Although polyimide is used as the material for the insulating substrate in this embodiment, the present invention is not limited to this embodiment. The material for the insulating substrate may be appropriately selected depending on what properties are required for the substrate, such as transparency and heat resistance.

The terminals 40 each extend along the longitudinal direction of the insulating substrate 10 in an area outside an image display area S of the insulating substrate 10. The terminals 40 are substantially evenly spaced in the transverse direction (the horizontal direction in FIG. 1) of the insulating substrate 10. The insulating substrate 10 has a terminal area on which the terminals 40 are thus arranged. The terminal area includes a first area E1 at which the terminals 40 are located and a second area E2 located between the terminals 40. As described later, on the first area E1, the insulating layer 50 is located between the terminals 40 and the insulating substrate 10. On the second area E2, no insulating layer 50 is located.

The counter substrate 20 is disposed to face the insulating substrate 10. Specifically, the counter substrate 20 is bonded to the side of the insulating substrate 10 on which the terminals 40 are disposed, so as not to cover the terminal area on which the terminals 40 are disposed. Examples of the counter substrate 20, which is disposed facing the insulating substrate 10, include a color filter substrate that allows a color of a specific wavelength to pass through it and blocks colors of the other wavelengths from passing through it.

The flexible wiring substrate 30 is joined to the terminals 40, which are disposed on the insulating substrate 10, via an anisotropic conductive material 60 (see FIG. 3) described later. Signals for controlling an image display function that the insulating substrate 10 has are input to the flexible wiring substrate 30. The dashed lines in FIG. 1 are hidden lines indicating the portions of the TFT substrate 10 and the terminals 40 which are covered with the flexible wiring substrate 30.

Figure 2A:
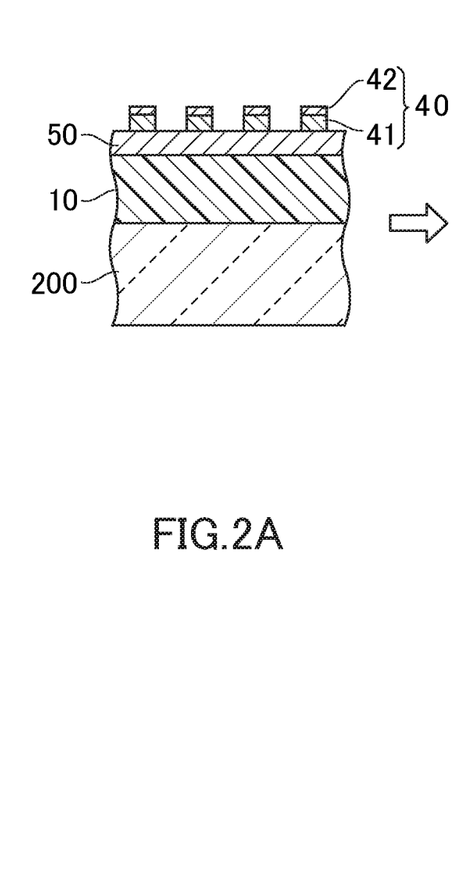
FIG. 2A is a diagram illustrating a process for manufacturing the display device according to the embodiment of the present invention.
Figure 2B:
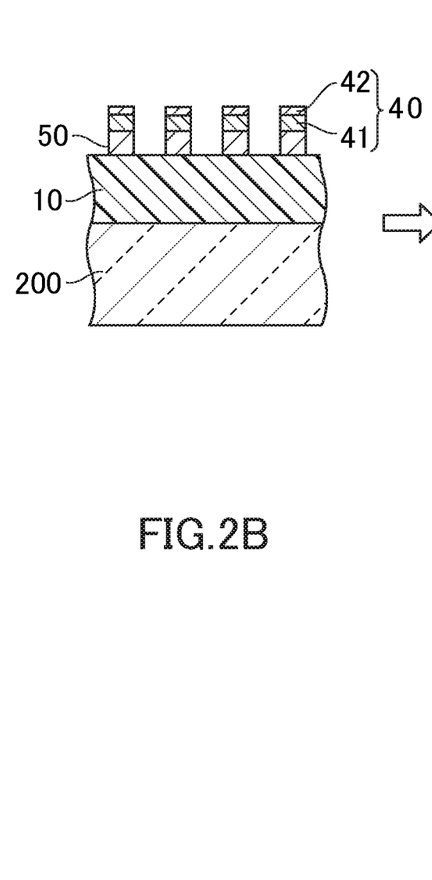
FIG. 2B is a diagram illustrating the process for manufacturing the display device according to the embodiment of the present invention.
Figure 2C:
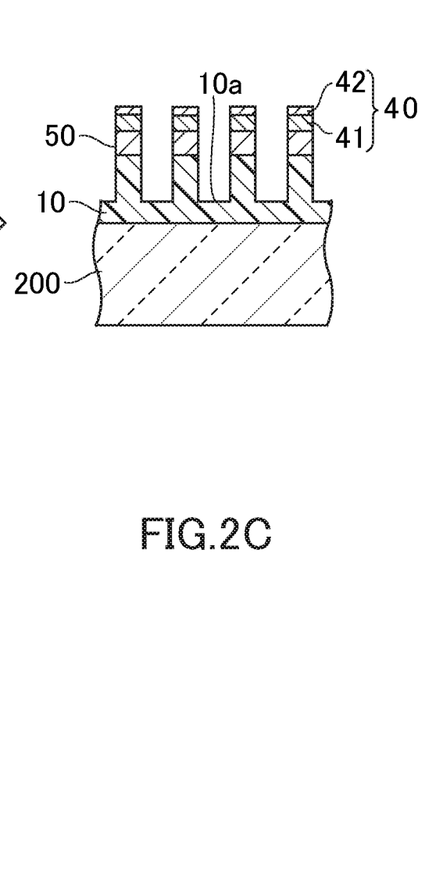
FIG. 2C is a diagram illustrating the process for manufacturing the display device according to the embodiment of the present invention.
Figure 3:
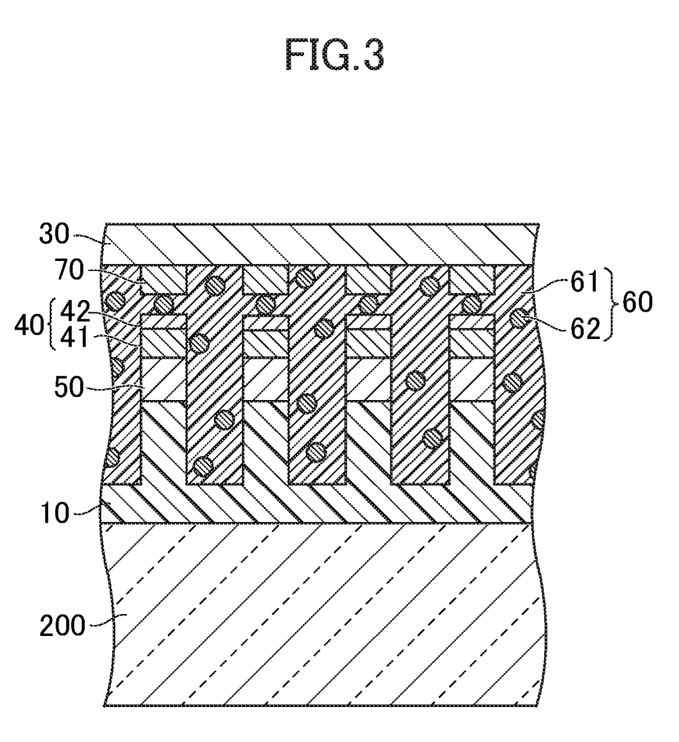
FIG. 3 is a schematic cross-sectional view of the display device according to the embodiment of the present invention before being peeled away from a glass substrate.

The following describes a process for manufacturing the display device 100 according to this embodiment with reference to FIGS. 2A to 2C and FIG. 3. FIGS. 2A to 2C are diagrams illustrating the process for manufacturing the display device 100 according to this embodiment. FIG. 3 is a schematic cross-sectional view of the display device 100 according to this embodiment before being peeled away from a glass substrate 200. FIGS. 2A to 2C and FIG. 3 are cross-sectional views of the insulating substrate 10 taken along a plane that is parallel to the transverse direction of the insulating substrate 10 and that includes the terminals 40 and the flexible wiring substrate 30.

First, the insulating substrate 10 is prepared. Specifically, on the glass substrate 200, the insulating substrate 10 is formed as a resin layer made of polyimide. The rigid glass substrate 200, on which the flexible insulating substrate 10 is thus formed, enables each layer forming the display device 100 to be stably stacked in the subsequent manufacturing process steps.

Subsequently, the insulating layer 50 containing silicon nitride (SiN), silicon oxide (SiO), or the like is formed on the insulating substrate 10 formed on the glass substrate 200.

Then, the plurality of terminals 40 made of a conductive material are formed on the insulating layer 50. Each of the terminals 40 has a metal portion 41 and an indium tin oxide layer (hereinafter, simply an ITO layer) 42. The metal portion 41 is formed of metal, such as titanium (Ti), aluminum (Al), or molybdenum (Mo), a stack of them, or an alloy of them. The ITO layer 42 prevents corrosion of the metal portion 41.

The substrate including the insulating substrate 10, the insulating layer 50, the terminals 40, and thin film transistors (TFTs) not shown is what is called a TFT substrate. The TFT substrate has the image display area S (the area inside the dot-dash line in FIG. 1) provided with the image display function. In the image display area S, thin film transistors and display elements are disposed.

Through the above steps, the multilayer substrate shown in FIG. 2A is formed.

After that, the counter substrate 20 is bonded to the side of the insulating substrate 10 on which the terminals are disposed, so as not to cover the terminal area on which the terminals 40 are disposed (see FIG. 1).

In a method for manufacturing the display device 100 according to this embodiment, moreover, a portion of the insulating layer 50 that is located between the terminals is removed. FIG. 2A shows the insulating layer 50 before the removal, and FIG. 2B shows the insulating layer 50 after the removal. As shown in FIGS. 2A and 2B, the portion of the insulating layer 50 that is located between the terminals is removed. Accordingly, the space to be filled with the anisotropic conductive material 60, which is described later, increases. For example, the insulating layer 50 is removed by dry etching.

In addition, a groove 10a is carved on an area of the insulating substrate 10 that is located between the terminals 40. The groove 10a is formed using the counter substrate 20 and the terminals 40 as a mask. The groove 10a is formed so as not to penetrate the insulating substrate 10. The groove 10a is formed, for example, by irradiating the insulating substrate 10 with ultraviolet (UV) laser light. FIG. 2C shows the groove 10a thus formed.

In this embodiment, the groove 10 is formed on the surface of the insulating substrate 10 entirely around the terminals 40. Specifically, the groove 10a is formed between the terminals 40 adjacent to each other (the area A in FIG. 1) and between the tips 40a of the terminals 40 and a leading edge portion 11 of the insulating substrate (the area B in FIG. 1). However, the present invention is not limited to this embodiment. Alternatively, the groove 10a may be formed on at least part of the area of the insulating substrate 10 that is inside the terminal area on which the terminals 40 are not covered with the counter substrate 20 and that does not overlap with the terminals 40.

Subsequently, the anisotropic conductive material 60 is provided between the insulating substrate 10 and the flexible wiring substrate 30. The anisotropic conductive material 60 is a thin film containing a thermosetting resin 61 and conductive particles 62 dispersed in the thermosetting resin 61. In this embodiment, a filmy anisotropic conductive film (ACF) is used as the anisotropic conductive material, but the present invention is not limited to this embodiment. Alternatively, a pasty anisotropic conductive paste (ACP) may be used.

First, the anisotropic conductive material 60 is provided between the insulating substrate 10 and the flexible wiring substrate 30, and then caused to flow by heating under pressure. After that, the thermosetting resin 61 that has cured joins the insulating substrate 10 and the flexible wiring substrate 30 via the anisotropic conductive material 60. As shown in FIG. 3, the anisotropic conductive material 60 here is filled into the gap between the terminals, including the groove 10a.

The flexible wiring substrate 30 has terminals 70 on its surface facing the insulating substrate 10. The terminals 40 on the insulating substrate 10 and the terminals 70 on the flexible wiring substrate 30 are electrically coupled to each other via the conductive particles 62. The diameter of the conductive particles 62 contained in the anisotropic conductive material 60 is sufficiently smaller than the distance between the terminals 40 adjacent to each other.

After that, the process for manufacturing the display device 100 is completed by peeling the glass substrate 200 away from the insulating substrate 10.

In manufacturing a display device, the thermosetting resin of the anisotropic conductive material sometimes escapes from the insulating substrate, through a side surface of the insulating substrate, to the boundary between the insulating substrate and the glass substrate. In that case, the thermosetting resin that has cured joins the insulating substrate and the glass substrate, which affects the step of peeling the insulating substrate away from the glass substrate. The display device 100 according to this embodiment is formed to prevent the thermosetting resin 61 from escaping in such a way. Specifically, as described above, the insulating substrate 10 has the groove 10a formed thereon between the terminals 40. The groove 10a thus formed allows enough space to be filled with the anisotropic conductive material 60.

In the display device 100 manufactured through the above process, the groove 10a increases the area of contact between the anisotropic conductive material 60 and the insulating substrate 10. Accordingly, adhesion between the anisotropic conductive material 60 and the insulating substrate 10 is improved. Consequently, the flexible wiring substrate 30 is more firmly joined to the insulating substrate 10.

Figure 4:
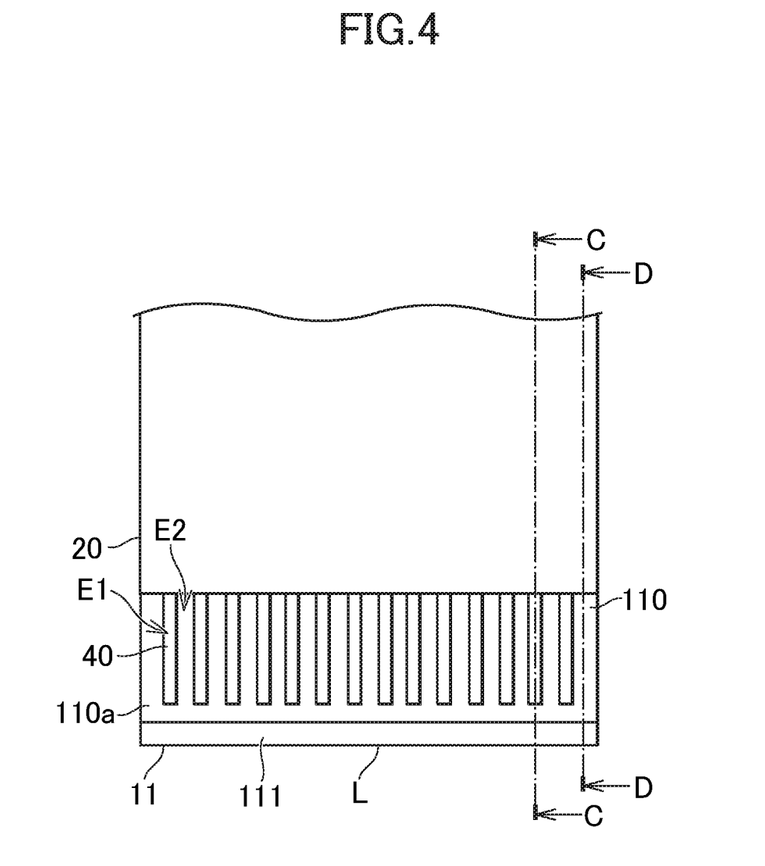
FIG. 4 is a diagram schematically showing an insulating substrate according to a modification of the embodiment of the present invention.
Figure 5A:
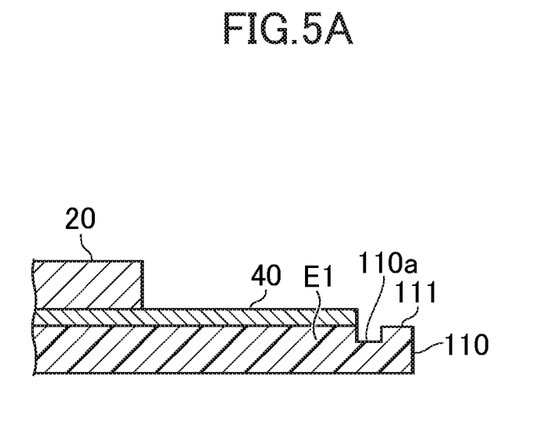
FIG. 5A is a cross-sectional view of the insulating substrate taken along line C-C in FIG. 4.
Figure 5B:
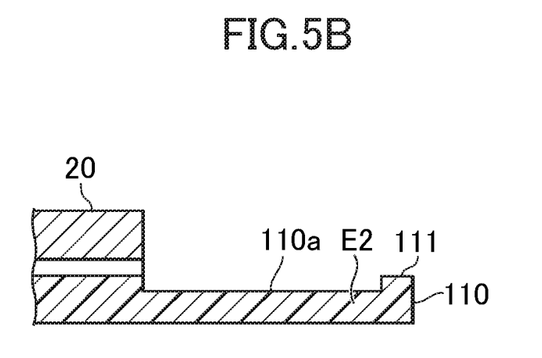
FIG. 5B is a cross-sectional view of the insulating substrate taken along line D-D in FIG. 4.
Figure 6A:
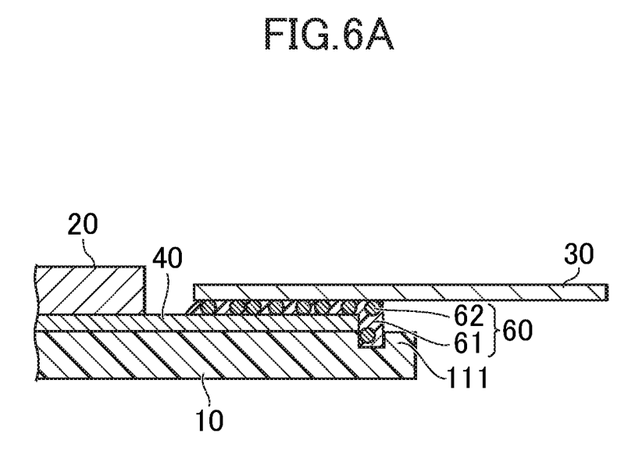
FIG. 6A shows how a flexible wiring substrate is joined to the insulating substrate shown in FIG. 5A via an anisotropic conductive material.
Figure 6B:
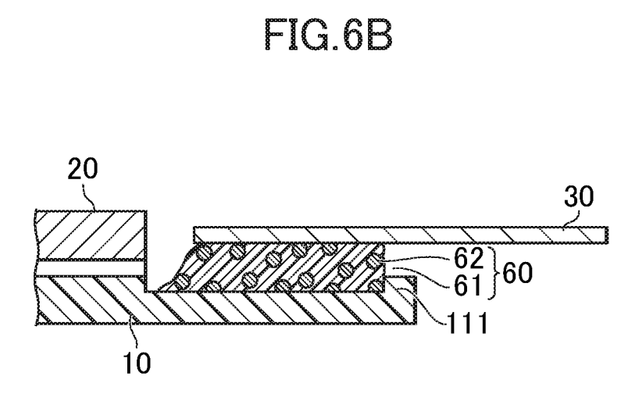
FIG. 6B shows how a flexible wiring substrate is joined to the insulating substrate shown in FIG. 5B via an anisotropic conductive material.

The present invention is not limited to the display device 100 described above, and various modifications may be made thereto. FIGS. 4 to 6B are diagrams showing a modification of the insulating substrate 10. FIG. 4 is a diagram schematically showing an insulating substrate 110 according to a modification of this embodiment. FIG. 5A is a cross-sectional view of the insulating substrate 110 taken along line C-C in FIG. 4, and FIG. 5B is a cross-sectional view of the insulating substrate 110 taken along line D-D in FIG. 4. FIGS. 6A and 6B respectively show how the flexible wiring substrate 30 is joined to the insulating substrate 110 shown in FIGS. 5A and 5B via the anisotropic conductive material 60. The insulating substrate 110 has a terminal area on which the terminals are arranged. The terminals 40 are arranged in a first direction, and the insulating substrate 110 has a side L extending in the first direction in the terminal area. The terminal area includes the first area E1 at which the terminals 40 are located, the second area E2 located between the terminals 40, and an area closer to the side L of the insulating substrate 110 than the first area E1 and the second area E2. On the first area E1, the insulating layer 50 is located between the terminals 40 and the insulating substrate 110. On the second area E2, no insulating layer 50 is located.

Use of the insulating substrate 110 shown in FIGS. 4 to 6B further prevents escape of the resin from the insulating substrate 110. Specifically, a groove 110a is formed away from the leading edge of an insulating substrate 110 so that a rib 111 (third area) is formed along the side L as a leading edge portion of the insulating substrate 110. In the insulating substrate 110, the thickness of the rib 111 (third area) is greater than the thickness of the second area E2 located between the terminals 40.

As shown in FIGS. 6A and 6B, the rib 111 is responsible for blocking the anisotropic conductive material 60 from escaping from the top of the insulating substrate 110. In the modification of this embodiment, the anisotropic conductive material 60 is disposed so as not to lie on the rib 111 of the insulating substrate 110.

In the display device according to the modification of this embodiment, such a configuration allows enough space to be filled with the anisotropic conductive material 60 and thus prevents the anisotropic conductive material 60 from escaping from the top of the insulating substrate 110.

While there have been described what are at present considered to be certain embodiments of the invention, it will be understood that various modifications may be made thereto, and it is intended that the appended claims cover all such modifications as fall within the true spirit and scope of the invention.

What is claimed is:

1. A display device comprising:
a flexible insulating substrate where an image display area is located;
an insulating layer on the flexible insulating substrate; and
a plurality of terminals made of a conductive material on the insulating layer, the insulating layer being located between the flexible insulating substrate and the terminals, wherein
the insulating layer overlaps the terminals and is not located between the terminals, and
the flexible insulating substrate has a groove between the plurality of terminals.

2. The display device according to claim 1, further comprising
a counter substrate bonded to a side of the flexible insulating substrate, so as not to cover a terminal area on which the plurality of terminals are disposed, the insulating layer disposed at the side,
wherein the groove is formed on at least a part of a region of the flexible insulating substrate, the region being in the terminal area and not overlapping with the plurality of terminals.

3. The display device according to claim 1, further comprising
a flexible wiring substrate joined to the plurality of terminals via an anisotropic conductive material,
wherein the anisotropic conductive material is filled into a gap between the flexible wiring substrate and the groove.

4. The display device according to claim 3, wherein
the groove is formed also between a tip of each of the terminals and a leading edge portion of the flexible insulating substrate, away from the leading edge portion of the flexible insulating substrate.

5. The display device according to claim 4, wherein
the anisotropic conductive material is disposed so as not to lie on the leading edge portion of the flexible insulating substrate.

6. A display device comprising:
a substrate having a terminal area on which a plurality of terminals are arranged;
an image display area located above the substrate; and
an insulating layer on the substrate, wherein
the terminal area includes a first area at which the plurality of terminals are located and a second area which is located between the terminals and does not overlap with the terminals,
the second area is an entire area between the terminals,
on the first area, the insulating layer is located between the plurality of terminals and the substrate, and
on the second area, the insulating layer is not located.

7. The display device according to claim 6, further comprising
a flexible wiring substrate joined to the plurality of terminals via an anisotropic conductive material,
wherein the anisotropic conductive material is located at least between the flexible wiring substrate and the second area.

8. The display device according to claim 6, wherein
the substrate has a first thickness that is a thickness of the first area and a second thickness that is a thickness of the second area, and
the first thickness is greater than the second thickness.

9. The display device according to claim 8, wherein
the plurality of terminals are arranged in a first direction,
the substrate has a side extending in the first direction in the terminal area and a rib located along the side, and
the lib has a thickness greater than the second thickness.

10. The display device according to claim 8, wherein
the plurality of terminals are arranged in a first direction,
the substrate has a side extending in the first direction in the terminal area,
each of the plurality of terminals has a tip facing the side,
the terminal area includes a third area between the side and the tips,
the substrate has a third thickness that is a thickness of the third area, and
the third thickness is greater than the second thickness.

11. The display device according to claim 10, wherein
the second area includes an area located between the third area and the tips.

12. The display device according to claim 11, further comprising
a flexible wiring substrate joined to the plurality of terminals via an anisotropic conductive material,
wherein the anisotropic conductive material is located at least between the flexible wiring substrate and the second area and is not located between the flexible wiring substrate and the third area.

* * * * *